United States Patent [19]

Levinson

[11] Patent Number: 4,808,938
[45] Date of Patent: Feb. 28, 1989

[54] IMPEDANCE-MATCHED SIGNAL SELECTING AND COMBINING SYSTEM

[75] Inventor: Samuel Levinson, Norwalk, Conn.

[73] Assignee: United Technologies Corporation, Hartford, Conn.

[21] Appl. No.: 120,440

[22] Filed: Nov. 13, 1987

[51] Int. Cl.⁴ .......................... G06G 7/28; H04N 5/22
[52] U.S. Cl. ..................................... 328/156; 333/128; 333/104; 307/241; 307/271; 307/555; 307/556; 328/104; 328/105; 328/137; 328/152
[58] Field of Search ..................... 307/296.6, 271, 242, 307/555, 556, 241; 328/104, 105, 137, 140, 152, 253, 154, 156, 166; 333/128, 104

[56] References Cited

U.S. PATENT DOCUMENTS

| | | | |
|---|---|---|---|
| 3,598,908 | 8/1971 | Poulett | 328/156 |
| 3,997,845 | 12/1976 | Wegstedt | 328/156 |
| 4,291,278 | 9/1981 | Quine | 333/128 |
| 4,308,473 | 12/1981 | Carnes | 307/243 |
| 4,511,813 | 4/1985 | Pan | 307/241 |

Primary Examiner—Stanley D. Miller
Assistant Examiner—Richard Roseen
Attorney, Agent, or Firm—Eric W. Petraske

[57] ABSTRACT

A circuit accepts as input a multi-frequency composite signal, such as that produced by a comb generator and passes on as an output signal switchably selected set of components of the input, so that the output signal may be varied by the selections of the components to be passed through.

4 Claims, 1 Drawing Sheet

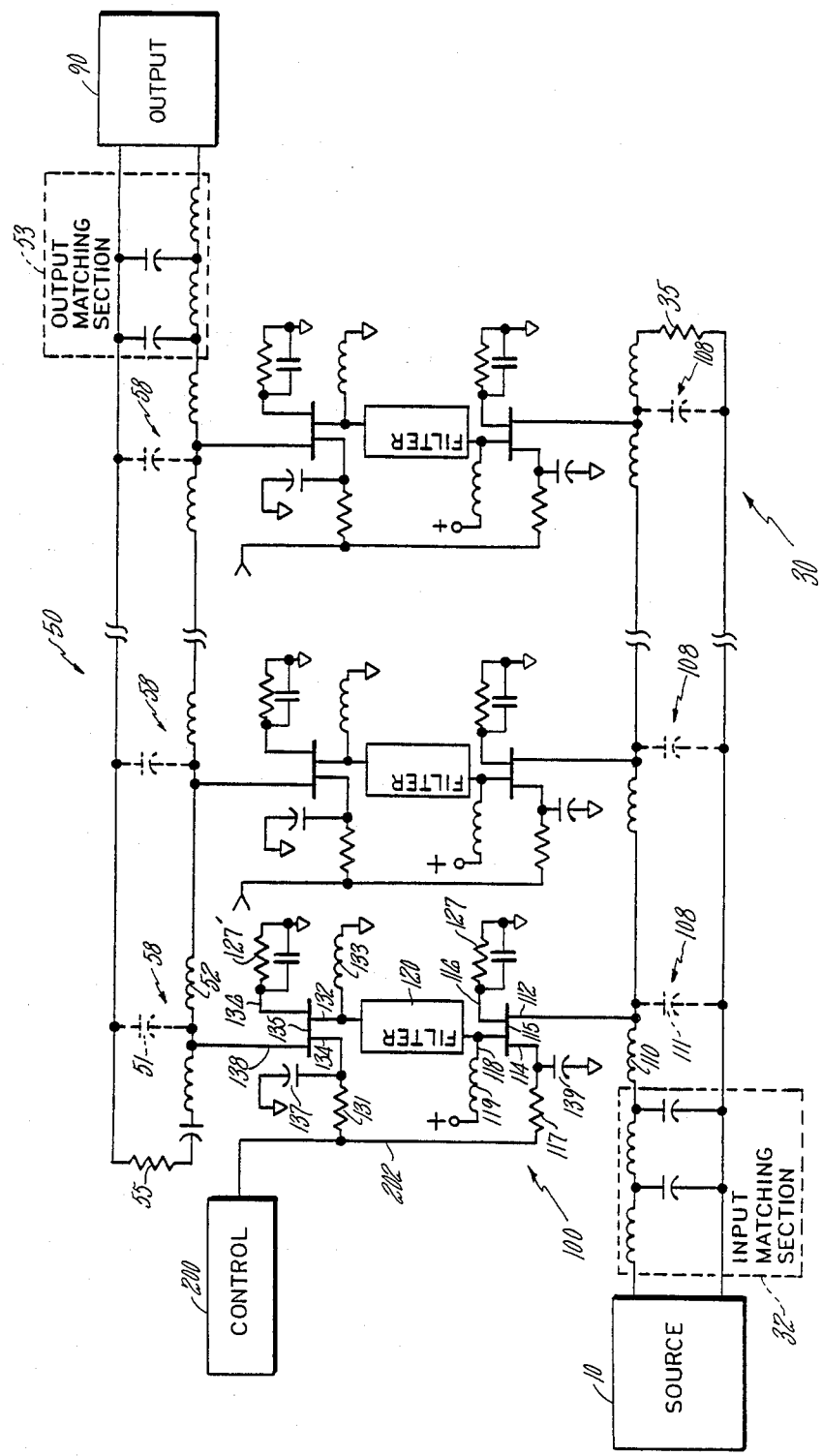

IMPEDANCE-MATCHED SIGNAL SELECTING AND COMBINING SYSTEM

TECHNICAL FIELD

The field of the invention is signal processing of radio frequency signals, in particular that of complex signals having a number of different frequency components.

BACKGROUND ART

In the field of rf signal processing, it has long been known to generate a complex signal from a set of oscillators, each of which generates a frequency component and combine the outputs to generate a complex signal. It is also known to process such a complex signal by separating the incoming signal into components in discrete frequency bands and then processing the outputs of the bands separately.

A circuit known in the art ("Distributed Amplifiers: Practical Considerations and Experimental Results", W. H. Horton et al. Proceedings of the I.R.E. July, 1950, page 748) is a "distributed amplifier", in which an input and output transmission line are connected by a plurality of separate amplifiers, each of which has a low gain. The outputs of these amplifiers are carefully combined with the correct phase and amplitude in order to provide a properly shaped output signal.

An application of signal processing in the microwave frequency region is illustrated in U.S. Pat. No. 4,511,813, in which a dual-gate FET is used as a signal combining/dividing device. In one application, an input signal connected to one gate of the dual-gate FET is coupled to the second gate and also to the drain.

DISCLOSURE OF INVENTION

The invention relates to an improved signal selection and combining circuit having superior impedance matching and a relatively low parts count. The circuit is used to process a complex input signal by separating the signal into selected frequency components and then combining those components to produce a second complex signal. An input transmission line is connected to an output transmission line by a plurality of high impedance frequency selection modules, switchably controlled to pass or reject selected frequency components, thereby providing a selectable output signal.

A feature of the invention is the provision of controllable gain on the individual frequency modules, thereby providing a further degree of freedom in configuring the output signal.

Other features and advantages will be apparent from the specification and claims and from the accompanying drawing which illustrate an embodiment of the invention.

BRIEF DESCRIPTION OF DRAWING

The sole FIGURE illustrates a schematic of an embodiment of the invention.

BEST MODE FOR CARRYING OUT THE INVENTION

Referring to the drawing, there is shown schematically an embodiment of the invention in which an input source 10 generates a complex input signal that passes along input transmission line 30 to a terminating resistor 35 at the end. A set of switchable filters denoted by the numeral 100 is connected in parallel between input transmission line 30 and a corresponding output transmission line 50 which is connected to an output device 90.

Each of the transmission lines 30 and 50 is a lumped-constant line having a series of nodes denoted respectively by the numerals 108 and 58. Each node 108 consists of an inductor 110 connected along transmission line 30 and a capacitor 111, which represents the capacitance of gate 112 of FET 115, connected across the transmission line. Counterpart capacitors 51 and induction 52 appear in output line 50. An optional input matching section 32 may be used if required to impedance match between circuit 10 and transmission line 30. An optional matching section 53 may be used on line 50. The input shunt resistance of gate 112 is very high compared to the characteristic impedance of the transmission line, so that the impedance seen by the input device 10 is independent of the number of filter units that are active at any time. This is because capacitance 111 and the shunt conductance of gate 112 are essentially constant whether FET 115 is on or off.

This is an advantage compared to prior art systems performing this function in past applications, which suffered from the problem that the impedance seen by the input device 10 depended on the number of filter units 100 that were active at any one time. Disadvantageously, some combinations of filter units produced an effective impedance that operated to suppress individual frequencies in the input signal, thus spoiling the effect of the selection process.

Referring now to filter unit 100, there is contained at the center of it a filter 120 which may be for example a surface acoustic wave filter or any other convenient type of filter. This filter is designed to pass a frequency range centered about a component frequency that will form one component of the output signal. In the particular case when the input signal is generated from a comb signal generator, then each filter will be matched to an individual frequency component of the comb generator. If the signal source is white noise or some complex signal, then the filter frequencies may be selected on any convenient basis.

A coupling section of the unit consists of a dual-gate FET 115 having gate one denoted by the numeral 112 and a second gate denoted by the numeral 114. Gate 112 is connected to node 108 of transmission line 30. The input admittance of such a dual-gate FET consists of a capacitance which in this case is substantially equal to the capacitance 111 of node 108, shunted by a high resistance that is much greater than the characteristic impedance of transmission line 30 and is omitted from the drawing for simplicity. With the capacitance of the transmission line node 111 equal to the value of the capacitance of gate 112, the parts count of the circuit may be reduced by eliminating separate capacitors 111. The high impedance of gate 112 advantageously results in a low power loss, so that the power loss on the transmission line is relatively insensitive to the number of filter units that are active at any one time.

Gate 114 of FET 115 is connected through resistor 117 to control unit 200 and serves to gate FET 115 on or off. As part of a bias circuit, resistor 117 connected to control device 200 operates to set FET 115 at a bias point to achieve a desired degree of amplification. FET 115 is functioning effectively as a gate controlled amplifier with controllable gain in this configuration, not as a simple on-off switch. In an alternative embodiment of the invention, controller 200 may respond to external signal or any other convenient source to adjust the gain of one or more component frequencies in real time. The output section of FET 115 is connected between a conventional power source not shown through inductor 119 to drain 118 and source 116 is connected through a bias network 127 to ground. (Other bias means are possible as desired.) The output impedance of drain 118 of FET 115 is typically much higher than the conventional impedance of filter 120. For maximum gain, the input impedance of filter 120 should be as high as is consistent with stable operation of the amplifier (FET 115).

At the output of filter 120, a corresponding FET 135 serves as an output signal transfer device. It provides further gain, if desired, and serves to isolate the output impedance of the system from the filters. Drain 138 of FET 135 (a few thousand ohms) has an output impedance much higher than the output impedance of a SAW filter (a few hundred ohms). If the filters were connected directly to the output transmission line, there would be problems with the variation of impedance with the combination of filters selected. For FET 135, gate 132 is connected to ground through inductor 133. Gate 134 acts as a corresponding gate control device, biased through resistor 131 to control device 200. The values resistors 117 and 131 may be set to provide a desired bias point, so that the signal from controller 200 results in operation of FETs 115 and 135 with a desired degree of amplification, which may be adjusted independently for the two FETs. Source 136 of FET 135 is connected through a bias network 127' to ground and drain 138 is connected to output node 58 of output transmission line 50. Capacitors 137 and 139 serve to suppress a potential signal path around filter 120 from gate 114 to gate 134. Node 58 has a capacitance 51 which is substantially equal to the output drain capacitance of FET 135.

Those skilled in the art will readily appreciate that control device 200 may switch one or more of filter modules 100 from an inactive state, in which no signal passes through, to an active state which passes a selected band of frequencies, centered on the value of the component frequency determined by filter 120 and having a characteristic frequency bandwidth, from transmission line 30 to transmission line 50 with a desired gain. Thus, the input signal may be entirely blocked; passed through with all frequency bands; or anything in between. In an illustrative embodiment, the input signal is a set of substantially separate frequencies from a comb signal generator or other signal source. The instant invention may also be used with a signal source having a continuous distribution of frequencies, if that is more convenient.

Control unit 200 may include further circuitry to apply a voltage of predetermined value along line 202 to resistors 117 and 131 to vary the gain of unit 100 within a limited range, thus affording a further degree of flexibility in that both the component frequencies of the signal on transmission line 50 may be varied and also the relative weights of those component frequencies may be varied.

Those skilled in the art will also readily appreciate that the embodiment illustrated is economical in that the use of dual-gate FETs 135 and 115 reduces the parts count compared to the parts required to implement a gain controlled impedance matched amplifier from other discrete units. Also, the selection of the lumped constant transmission lines to have a characteristic node capacitance substantially the same as that of the gate capacitance of the FETs eliminates the need for a set of capacitors, thereby further reducing the cost.

It should be understood that the invention is not limited to the particular embodiments shown and described herein, but that various changes and modifications may be made without departing from the spirit and scope of this novel concept as defined by the following claims.

I claim:

1. A switchable circuit for transforming a complex rf input signal having at least two frequency components in a predetermined frequency range to an rf output signal having a predetermined combination of said at least two components, in which a circuit input impedance remains substantially constant for different switched combinations of said at least two frequency components comprising:

an input transmission line having an input line impedance;

at least two frequency selection modules connected in parallel to said input transmission line, for selecting and passing therethrough rf signals in a predetermined frequency sub-range about a predetermined one of said at least two frequency components to form a component signal centered about one of said at least two frequency components;

an output transmission line, having an output line impedance, connected in parallel to said at least two frequency selection modules;

control means for sending at least one enable signal to said at least two frequency selection modules for switching said frequency selection modules between active and inactive states, whereby component signals from selected ones of said at least two frequency selection modules combine in said output transmission line to form said output signal;

at least two switchable input means, responsive to said enable signal and within each of said at least two frequency selection modules, for controllably passing a signal from said input transmission line into said frequency selection module, said switchable input means having an input impedance large compared with said input line impedance and invariant with respect to the active or inactive state of said frequency selection module;

filter means having a predetermined component frequency characteristic within each of said at least two frequency selection modules and connected to said switchable input means, for passing therethrough rf signals in a frequency sub-range and blocking signals outside said frequency sub-range;

switchable output means, responsive to said enable signal and connected between said filter and said output transmission line, and having an output impedance large compared with said output line impedance, for transmitting rf signals passed by said filter means to said output transmission line.

2. A circuit according to claim 1, in which said input transmission line is a lumped-constant transmission line comprising a plurality of nodes serially connected by inductors and having a node capacitance substantially equal to a predetermined input capacitance of said switchable input means, whereby said switchable input means serves the dual functions of transferring input signals from said input transmission line to said frequency selection module and of forming the node capacitance of said input transmission line; and said output transmission line is a lumped-constant transmission line comprising a plurality of nodes serially connected by inductors and having a node capacitance substantially equal to a predetermined output capacitance of said switchable output means, whereby said switchable output means serves the dual functions of transferring input signals from said frequency selection module to said output and of forming the node capacitance of said output transmission line.

3. A system according to claim 2, in which said switchable input means is a dual-gate FET having a first gate connected to a node of said input transmission line and providing the node capacitance thereof and a second gate connected to said control means; and said switchable output means is also a dual-gate FET having a first gate connected to said filter, a second gate connected to said control means, and a drain, having a drain capacitance, connected to a node of said output transmission line and providing the node capacitance thereof.

4. A system according to claim 3, further including bias means within said control means for setting said enable signal to a predetermined voltage level for at least one of said switchable input means and switchable output means, whereby said predetermined voltage level determines amplitude of signals passing therethrough.

* * * * *